United States Patent [19]
Ali

[11] Patent Number: 5,945,848
[45] Date of Patent: Aug. 31, 1999

[54] EFFECTIVELY DIFFERENTIAL, MULTIPLE INPUT OR/NOR GATE ARCHITECTURE

[75] Inventor: Akbar Ali, Garden Grove, Calif.

[73] Assignee: Rockwell Semiconductor Systems, Inc., Newport Beach, Calif.

[21] Appl. No.: 08/752,016

[22] Filed: Nov. 19, 1996

[51] Int. Cl.[6] .................................. H03K 19/086
[52] U.S. Cl. ................................. 326/127; 326/18
[58] Field of Search .................. 326/10, 26, 126, 326/127; 327/72, 561, 563

[56] References Cited

U.S. PATENT DOCUMENTS

| | | | |
|---|---|---|---|
| 4,924,116 | 5/1990 | Vu et al. | 326/32 |
| 4,972,103 | 11/1990 | Barbu | 326/18 |
| 5,350,950 | 9/1994 | Inaba et al. | 327/72 |
| 5,408,145 | 4/1995 | Ali | 326/121 |
| 5,604,456 | 2/1997 | Nitta | 327/563 |

FOREIGN PATENT DOCUMENTS

| 3-135224 | 6/1991 | Japan | 326/126 |
|---|---|---|---|

*Primary Examiner*—Jon Santamauro
*Assistant Examiner*—Don Phu Le
*Attorney, Agent, or Firm*—Philip K. Yu; Snell & Wilmer

[57] ABSTRACT

A multiple input, low voltage, OR/NOR gate architecture based on a single-ended OR/NOR gate circuit, wherein a plurality of input transistors are connected in parallel. A reference transistor connects to the input transistors. A feedback means connects the NOR output signal to the base or gate of the reference transistor. The feedback means provides an effectively differential input for the multiple input circuit, without increasing circuit complexity, thereby providing enhanced noise margin characteristics.

8 Claims, 5 Drawing Sheets

(NON OPERATIVE)

EFFECTIVELY DIFFERENTIAL, MULTIPLE INPUT OR/NOR GATE ARCHITECTURE

BACKGROUND OF THE INVENTION

1. Field of the Invention

The present invention relates generally to transistor logic circuits and, more particularly, to a low voltage, effectively differential, multiple input OR/NOR gate architecture.

2. Description of Related Art

Digital logic circuits, the basic building blocks of digital systems, are widely known and available. One of the most common and fundamental logic blocks is the "OR/NOR" gate. The output of the logical "OR" function is true if any input is true. The "NOR" function, so called because it is the logical "NOT OR," is the inverse of the OR function, and is only true when all inputs are false. In certain logic families, circuits which implement the OR function usually provide a NOR output as well. Thus, the circuits are commonly referred to as OR/NOR circuits.

It is often necessary to perform OR/NOR functions on more than two digital signals. One solution is to "cascade" two-input gates in order to create a circuit having the required number of inputs. Two-input gates can be designed to process differential signal inputs which greatly improves the circuit's noise margin characteristics. With differential inputs, any noise on one input is effectively cancelled due to the differential nature of the input signal. Noise margin is an important design criteria because the greater the noise margin the less chance a "noisy" signal will cause the gate to output the wrong value. However, cascading two-input gates increases the signal propagation delay, resulting in a slower overall circuit. Furthermore, the increase in the number of gates increases circuit costs in terms of power consumption and chip area.

Another prior art solution provides multiple inputs in a single circuit. In this circuit, a reference or bias voltage is applied to a reference transistor and the inputs are "single-ended" inputs and not differential. This multiple input circuit has a shorter propagation delay than cascading two-input gates, but has poor noise margin. Since the inputs are not really differential, noise may cause the output to switch incorrectly. For logic levels with a large voltage difference between the high and low logic levels, the noise margin may be sufficient. For circuits which use low voltage differences between the high and low logic levels, however, even the slightest noise can have a negative effect on circuit performance. For example, in the Emitter Coupled Logic (ECL) family, there is only a few tenths of a volt difference between the high and low logic levels. Any noise at the input exceeding half of the voltage difference can cause the output to switch to the incorrect value.

U.S. Pat. No. 5,408,145 discloses a CMOS NOR gate circuit having low power requirements and providing high speed switching between logic states. However, the circuit does not provide high noise immunity while requiring only single-ended inputs.

Thus, there is a need for a multiple input OR/NOR gate circuit which offers higher noise immunity to work with low voltage logic families. Also, it would be desirable to have a circuit which can be implemented in a very simple way, without a significant increase in the number of required transistors, and without an increase in power consumption.

SUMMARY OF THE INVENTION

A multiple input, low voltage, OR/NOR gate architecture based on a single-ended input OR/NOR gate circuit, wherein the input transistors are connected in parallel. The emitters of the input transistors are connected to the emitter of a reference transistor. A current source connects to the emitters of the input and reference transistors. The collectors of the input transistors are connected together and a feedback means connects the collectors of the input transistors to the base of the reference transistor. The feedback means provides an effectively differential switching function for the multiple input circuit without a significant increase in circuit complexity.

BRIEF DESCRIPTION OF THE DRAWINGS

The exact nature of this invention, as well as its objects and advantages, will become readily apparent from consideration of the following specification as illustrated in the accompanying drawings, in which like reference numerals designate like parts throughout the figures thereof, and wherein.

DETAILED DESCRIPTION OF THE PREFERRED EMBODIMENTS

The following description is provided to enable any person skilled in the art to make and use the invention and sets forth the best modes contemplated by the inventor for carrying out the invention. Various modifications, however, will remain readily apparent to those skilled in the art, since the basic principles of the present invention have been defined herein specifically to provide a low voltage, effectively differential, multiple input OR/NOR gate architecture.

Figure 1:
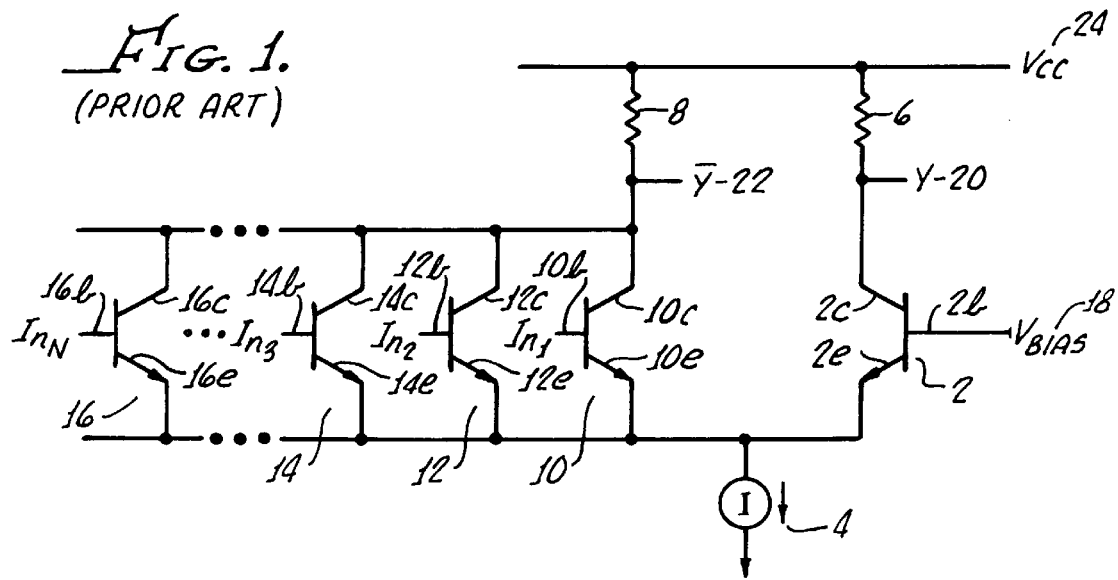
FIG. 1 is a circuit diagram of a prior art multiple input OR/NOR gate which requires a bias voltage to be applied to a reference transistor.

The circuit shown in FIG. 1 is an example of a prior art multiple single-ended input OR/NOR gate. A bias voltage $V_{BIAS}$ 18 is input to the base 2b of a reference transistor 2.

The emitter 2e of the reference transistor 2 connects to a current source 4 and also to the emitters 10e, 12e, 14e, 16e of a plurality of input transistors 10, 12, 14, 16. The current source 4 is oriented such that the current is flowing away from the transistors. The collector 2c of the reference transistor 2 connects to a first end of a first resistor 6. A second end of the first resistor 6 connects to a second end of a second resistor 8 and to the supply voltage $V_{CC}$ 24. A first end of the second resistor 8 connects to the collectors 10c 12c, 14c, 16c of the plurality of input transistors 10, 12, 14, 16. The plurality of input transistors 10, 12, 14, 16 are effectively connected in "parallel" to each other in that the collectors 10c, 12c, 14c, 16c of the input transistors are electrically connected to each other and the first end of the second resistor 8. The emitters 10e, 12e, 14e. 16e are similarly electrically connected to each other and to the emitter 2e of the reference transistor 2. The emitters 10e, 12e, 14e, 16e also connect to the current source 4. The bases 10b, 12b, 14b, 16b of the input transistors 10, 12, 14, 16 are supplied with the input signals to the logic gate circuit, specifically, $I_{n1}$, $I_{n2}$, $I_{n3}$, and $I_{nN}$, respectively.

Figure 2:
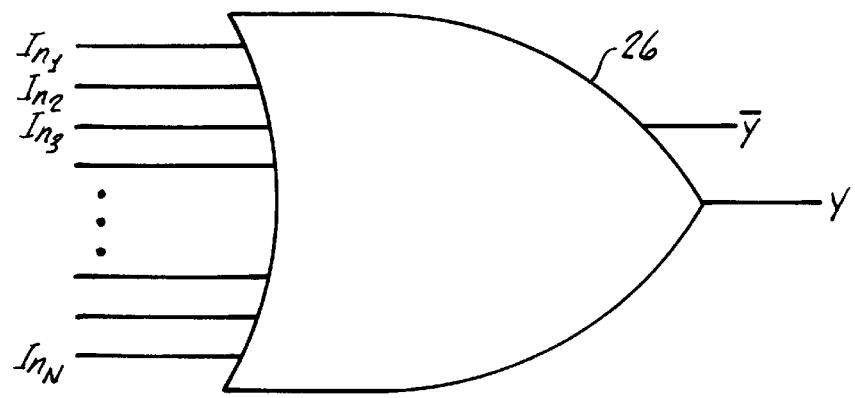
FIG. 2 is a logical symbol illustrating the circuit of FIG. 1.
Figure 3:
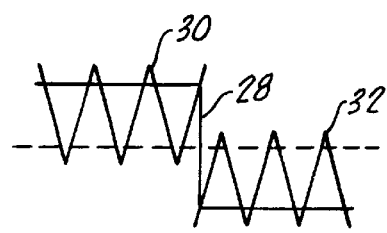
FIG. 3 illustrates the signal-to-noise characteristics of the prior art multiple input circuit.

FIG. 2 shows a logical block diagram 26 of the circuit of FIG. 1. Multiple inputs are accommodated with both "OR" and "NOR" outputs provided. However, the circuit is highly susceptible to noise since $V_{BIAS}$ 18 is fixed. As illustrated in FIG. 3, excessive noise on an input line may cause the output to be incorrect. Input signal 28 is shown transitioning from a high logic level to a low logic level. Noise 30 superimposed on the input signal 28 during a high logic state may cause the signal voltage level to approach the low logic level voltage range. If this occurs, the output signal could switch to the incorrect logic level. Likewise, noise 32 superimposed on input signal 28 during a low logic state may cause the signal voltage level to approach the high logic level voltage range. If the difference between the voltages representing the high and low logic levels is large relative to the noise, the circuit of FIG. 1 may perform satisfactorily. Logic families using logic levels having large voltage differences, however, require more power and are generally slower than logic families which use low voltage levels. For example, Emitter Coupled Logic (ECL) circuits use only a few tenths of a volt difference between the high and low logic levels. Thus, for ECL circuits, noise considerations are extremely important.

Figure 4:
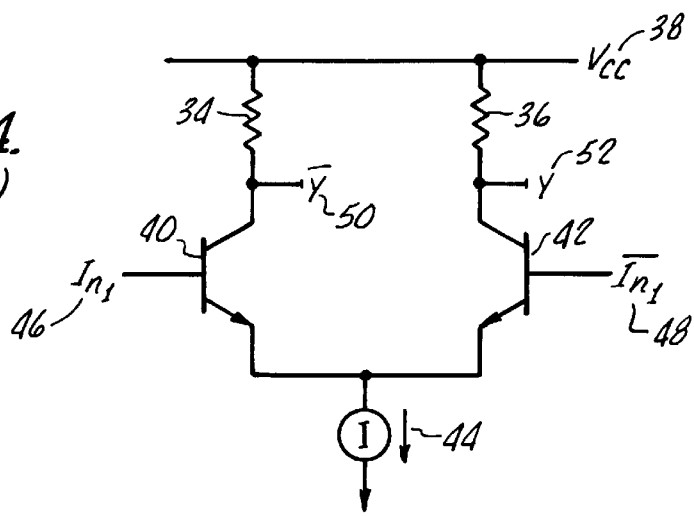
FIG. 4 is a circuit diagram of a prior art differential input/output circuit.

Another prior art differential circuit is shown in FIG. 4, specifically, the circuit illustrates a partial differential input circuit for one input. Input $I_{n1}$ is applied to the base of a first input transistor 40. The emitter of the input transistor 40 connects to a current source 44 and to the emitter of a second input transistor 42. The current source 44 is oriented such that the current flows away from the transistors 40, 42. Input $\bar{I}_{n1}$ 48 is the inverse of signal $I_{n1}$ 46 and is applied to the base of the second input transistor 42. The collector of the first input transistor 40 connects to one end of a resistor 34, the opposite end of the resistor 34 connecting to a supply voltage $V_{CC}$ 38. Similarly, the collector of the second input transistor connects to one end of a second resistor 36, the second end of the second resistor 36 connecting to the supply voltage $V_{CC}$ 38 and to the first resistor 34.

Figure 5:
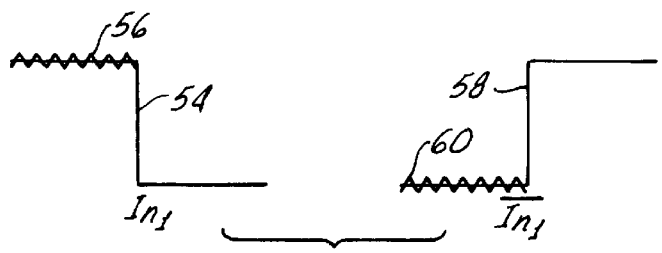
FIG. 5 illustrates the signal-to-noise cancelling effect of the differential input circuit.

The unique properties of this circuit are illustrated in FIG. 5. As shown, when an input signal $I_{n1}$ 54 is at a high logic level, the inverse signal has noise $\bar{I}_{n1}$ 58 is at a low logic level. Any noise 56 which appears on the input signal $I_{n1}$ 54, also appears on input $\bar{I}_{n1}$ 58 as noise 60. However, any noise 56 on signal $I_{n1}$ 54 is at a high logic level, while the noise 60 on input $\bar{I}_{n1}$ 58 is at a low logic level. Likewise, when input signal $I_{n1}$ 54 is at a low logic level, input $\bar{I}_{n1}$ 58 is at a high logic level and therefore the noise signals 56, 60 are inversed. The differential circuit thus operates to "cancel" out the noise on the inverted signals. The circuit of FIG. 4 provides better noise margin characteristics than can be obtained from the circuit illustrated in FIG. 1 and therefore can be used to design low voltage logic families.

Figure 6:
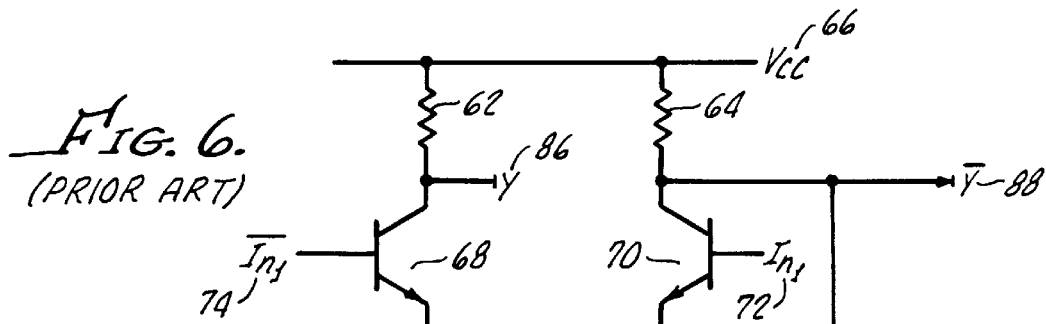
FIG. 6 is a circuit diagram of a prior art OR/NOR gate with two differential inputs.

FIG. 6 shows a schematic circuit diagram of a differential input OR/NOR gate with two inputs, $I_{n1}$ 72 and $I_{n2}$ 80. The circuit may be implemented using more than two inputs, but a higher VCC supply voltage is required. The differential stage with inputs $\bar{I}_{n1}$ 72 and $\bar{I}_{n1}$ 74 corresponds to the partial differential circuit shown in FIG. 4, with the inputs reversed. A second differential stage has been added for inputs $I_{n2}$ 80 and $\bar{I}_{n2}$ 82. Input $I_{n1}$ 72 is applied to the base of a first input transistor 70 and input $\bar{I}_{n1}$ 74 is applied to the base of a second input transistor 68. The collector of the first input transistor connects to one end of a first resistor 64. The other end of the first resistor connects to the supply voltage $V_{cc}$ 66 and to a second resistor 62. The second end of the second resistor 62 connects to the collector of the second input transistor 68. The emitters of the first and second transistors 68, 70 connect to the collector of a third input transistor 76. Input $\bar{I}_{n2}$ 82 is applied to the base of the third input transistor 76 and input $I_{n2}$ 80 is applied to the base of a fourth input transistor 78. The emitters of the third and fourth transistors 76, 78 connect to a current source 84, wherein the current of the current source 84 flows in a direction away from the transistors. The collector of the fourth transistor 78 connects back to the collector of the first input transistor 70.

The OR'd output Y 86 is taken from the collector of the second input transistor 68, while the NOR'd output $\bar{Y}$ 88 is taken from the collectors of the first and fourth input transistors 70, 78. Note that both OR and NOR outputs are available, with differential inputs providing the desired noise margin.

Figure 7:
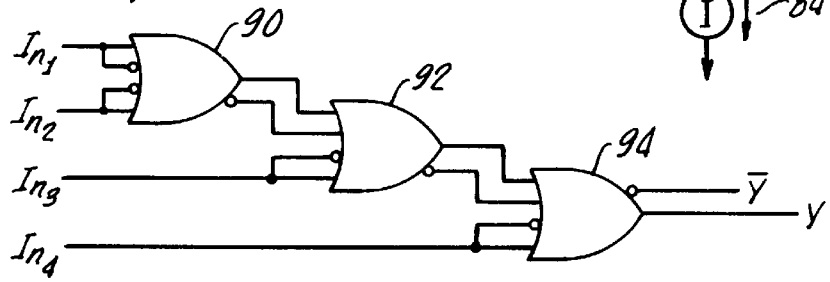
FIG. 7 illustrates the cascading of two-input OR/NOR gates to create an effectively multiple input logic block.

The circuit of FIG. 6, however, has one serious drawback when designing for more inputs. For each added stage, the supply voltage $V_{cc}$ 66 must increase in order to properly power the circuit. In applications in which the supply voltage is relatively low, additional inputs cannot be supported according to the circuit of FIG. 6. Alternatively, the two input circuit of FIG. 6 may be "cascaded" as shown in FIG. 7 to provide a multiple input block. The OR/NOR gates 90, 92, 94 are cascaded together, effectively providing a multiple input block. However, for each gate that is added, the propagation delay increases, which reduces the speed of the over-all circuit. Cascading the gates also increases the required amount of circuitry.

Figure 8:
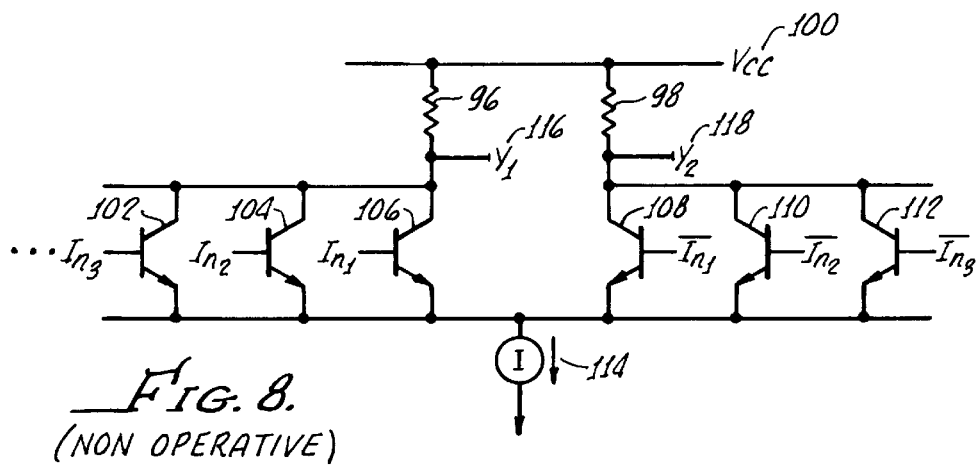
FIG. 8 is a circuit diagram illustrating a nonfunctional combination of the prior art multiple input gate of FIG. 1 and the differential circuit of FIG. 4.

An ideal solution would therefore combine the multiple inputs of the circuit illustrated in FIG. 1, with the noise margin characteristics of the differential input circuit shown in FIGS. 4 and 6. A hypothetical combination of the two circuits is shown in FIG. 8. The input side of the circuit corresponds to the multiple input circuit of FIG. 1. The input transistors 106, 104, 102, the resistors 96, 98, the supply voltage $V_{cc}$ 100 and the current drain 114 all correspond to the normal multiple input circuit configuration of FIG. 1. Instead of having a single reference transistor biased with a bias voltage, however, the circuit has a plurality of differential input transistors 108, 110, 112. This hypothetical combination, however, is nonfunctional. The output signals $Y_1$ 116 and $Y_2$ 118 would be indeterminate and would not necessarily provide the correct OR or NOR logic signals for given input signals. Furthermore, such a construction would basically require twice as many transistors as the multiple input circuit illustrated in FIG. 1. Thus, simply combining the prior art circuits of FIGS. 1 and 6 does not solve the multiple differential input problem.

Figure 9:
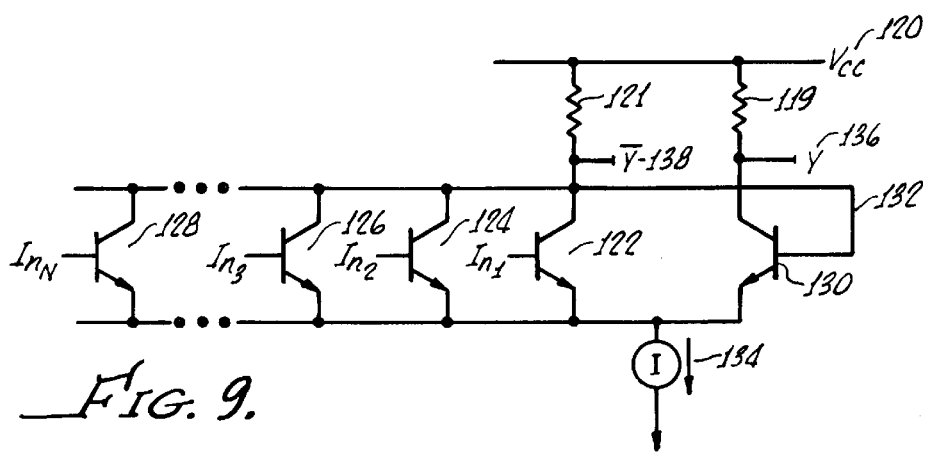
FIG. 9 is a circuit diagram illustrating the present invention implemented in Current-Mode Logic (CML) showing the feedback means.

The present solution which combines multiple inputs with the noise margin characteristics of the differential input circuit is shown in FIG. 9. The circuit of FIG. 9 illustrates the present invention as implemented in Current Mode Logic (CML). One unique design aspect of CML includes the fact that the output is not buffered, but is taken right from a resistor, hence only one current source is required. However, any load will significantly pull down the output. Also, in CML, the high logic level is equal to the supply voltage, which has a minimum value of approximately 1.9 volt, while the low logic level is equal to the supply voltage minus three tenths (0.3) of a volt. Since only three tenths (0.3) of a volt separate the high and low logic levels, noise is an important design concern.

In the circuit shown in FIG. 9, a plurality of input transistors 122, 124, 126, 128 are connected in "parallel", with the emitters electrically connected. The collectors of the input transistors 122, 124, 126, 128 are also electrically connected. The input signals $I_{n1}, I_{n2}, I_{n3}, I_{nN}$ are applied to the bases of the input transistors 122, 124, 126, 128, respectively. The emitter of a single reference transistor 130 connects to the emitters of the input transistors 122, 124, 126, 128 and to a current source 134. The current direction of the current source 134 is directed away from the transistors of the circuit. The collector of the reference transistor 130 connects to a first end of a first resistor 119. A second end of the first resistor 119 connects to a second end of a second resistor 121 and to a supply voltage $V_{cc}$ 120. A first end of the second resistor 121 connects to the collectors of the plurality of input transistors 122, 124, 126, 128. Instead of having a fixed bias voltage connected to the base of the reference transistor, however, a feedback loop 132 connects the base of the reference transistor to the collectors of the plurality of input transistors 122, 124, 126, 128 and the first end of the second resistor 121. The OR output Y 36 is taken from the connection of the collector of the reference transistor 130 and the first resistor 119. The NOR output $\overline{Y}$ 138 is taken from the connection of the plurality of input transistor collectors and the second resistor 121.

Unlike the circuit of FIG. 1, the input to the reference transistor 130 is not fixed, but is equal to the NOR output $\overline{Y}$ 138. Since the NOR output is always the inverse of the OR output, the feedback loop provides an effectively differential input for the circuit. The noise characteristics, discussed below, show that the circuit provides a good noise margin. This is accomplished by means of a very simple circuit using the feedback loop 132, without any additional transistors or circuit complexity.

Figure 10:
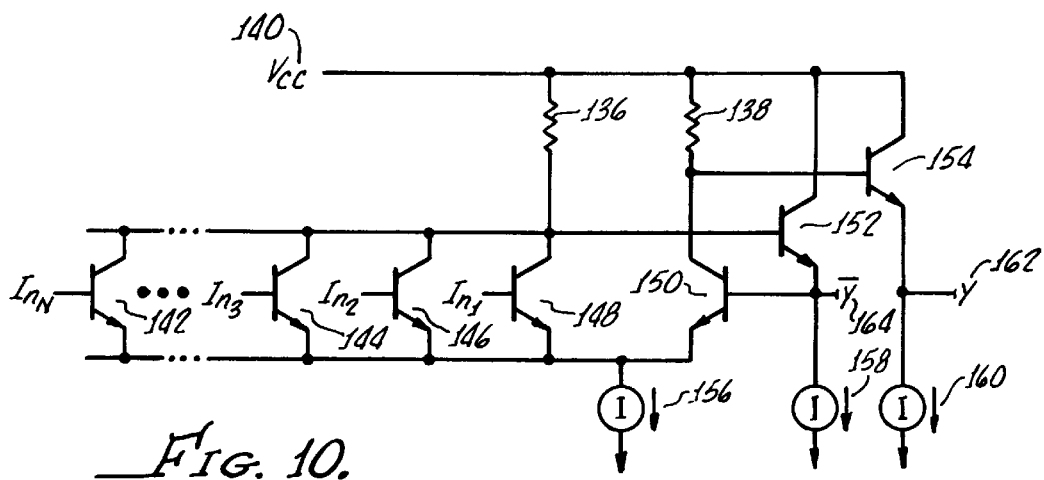
FIG. 10 is a circuit diagram illustrating the present invention implemented in Emitter Coupled Logic (ECL) showing the feedback means.

FIG. 10 illustrates the present invention as implemented in Emitter Coupled Logic (ECL). The outputs in ECL are buffered, but greater current is required in order to drive the extra transistors. The minimum supply voltage is approximately 2.7 volts, and the voltage difference between the high and low logic levels is six tenths (0.6) of a volt.

In FIG. 10, a plurality of input transistors 142, 144, 146, 148 are connected such that the emitters are electrically connected and the collectors are electrically connected. The input signals $I_1, I_{n2}, I_{n3}, I_{nN}$ are applied to the bases of the input transistors. The emitter of a reference transistor 150 connects to the emitters of the input transistors 142, 144, 146, 148 and to a current source 156. The current of the current source 156 is directed away from the transistors of the circuit. The collector of the reference transistor 150 connects to a first end of a first resistor 138. A second end of the first resistor 138 connects to a supply voltage $V_{cc}$ 140 and to a first end of a second resistor 136. The second end of the second resistor connects to the collectors of the input transistors 142, 144, 146, 148. In this embodiment, the feedback means comprises a feedback transistor 152, which also acts as a level shifter. The base of the feedback transistor 152 connects to the connection of the collectors of the input transistors 142, 144, 146, 148 and the second resistor 136. The collector of the feedback transistor 152 connects to the supply voltage $V_{cc}$ 140 and to the resistors 136, 138. The emitter of the feedback transistor 152 connects to the base of the reference transistor 150 and to a current source 158. The current of the current source 158 is directed away from the feedback transistor 152.

The NOR output $\overline{Y}$ 164 is taken from the feedback transistor 152 emitter and reference transistor 150 base connection. Notice that the NOR output is again fed back into the reference transistor 150. The feedback transistor also buffers the NOR output. A level shift transistor 154 is used to provide a buffered OR output. The collector of the level shift transistor 154 connects to the supply voltage $V_{cc}$ 140, the collector of the feedback transistor 152 and to the resistors 136, 138. The base of the level shift transistor 154 connects to the reference transistor 150 and first resistor 138 connection. The emitter of the level shift transistor connects to a current source 160, wherein the current is directed away from the level shift transistor 154. The OR output Y 162 is taken from the emitter of the level shit transistor 154. This arrangement provides buffered outputs so that the outputs Y 162 and $\overline{Y}$ 164 do not directly vary with the load that is being driven by the circuit.

For purposes of illustration, bipolar transistors have been shown. Those skilled in the art will appreciate that other transistor technologies, such as Field Effect Transistors (FETs), may also be used without departing from the scope of the present invention.

Figure 11:
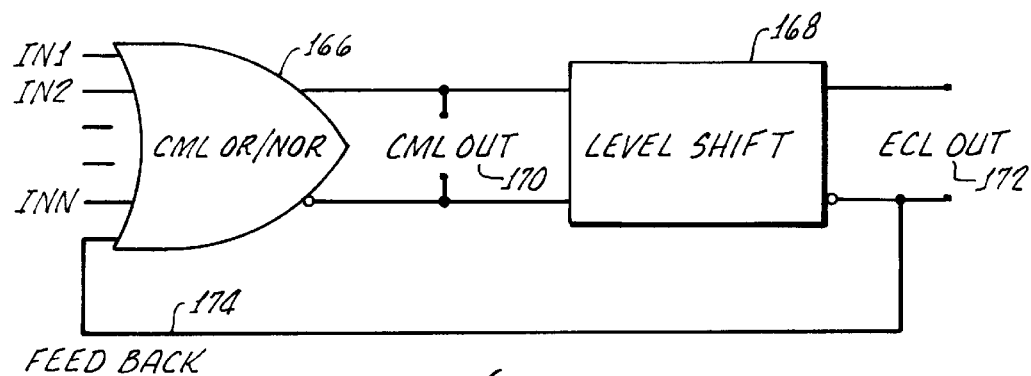
FIG. 11 is a high level block diagram of the present invention in an ECL configuration.

A high-level block diagram of the present invention is shown in FIG. 11. The OR/NOR block 166 is supplied with the inputs to be OR'd or NOR'd. In addition, the feedback means 174 provides a feedback input to the OR/NOR block 166 as well. The CML output 170 is taken directly from the gate 166, the ECL output 172, however, is taken after the output signals have been level shifted by the level shift 168. Notice that the feedback means 174 is feeding back the inverse (NOR) output, therefore providing an effectively differential input to the OR/NOR block 166.

Figure 12:
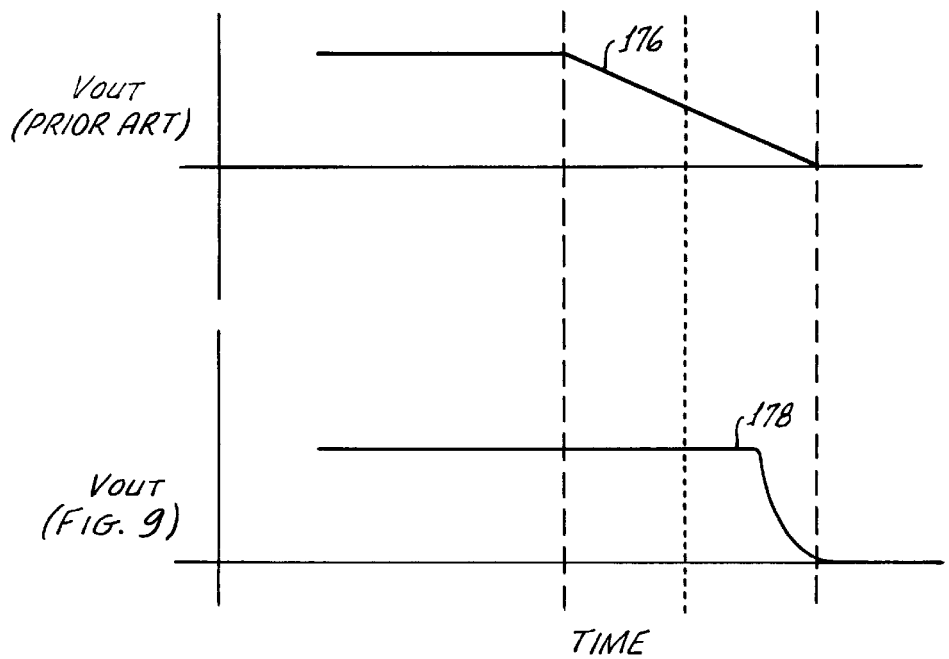
FIG. 12 is a graph showing the transfer characteristics of a prior art OR/NOR gate circuit compared with the transfer characteristics of the present invention.

A comparison of the switching characteristics of the present invention with the prior art circuit of FIG. 1 is shown in FIG. 12. $V_{out}$ 176 for the prior art circuit shows a constant slope between the beginning of the input signal change and the final value. $V_{out}$ 178 for the present invention remains constant for approximately 70% of the transition period. Then the signal changes values from the high logic level to the low logic level relatively quickly. Any noise on the input of the prior art circuit may be reflected on the output, since the signal transition is relatively gradual. However, in the present invention, the noise margin is greater since the output signal will not change until the input signal has almost completely transitioned between logic levels. Thus, the present invention has improved noise margin characteristics as compared to the circuit of FIG. 1.

Figure 13:
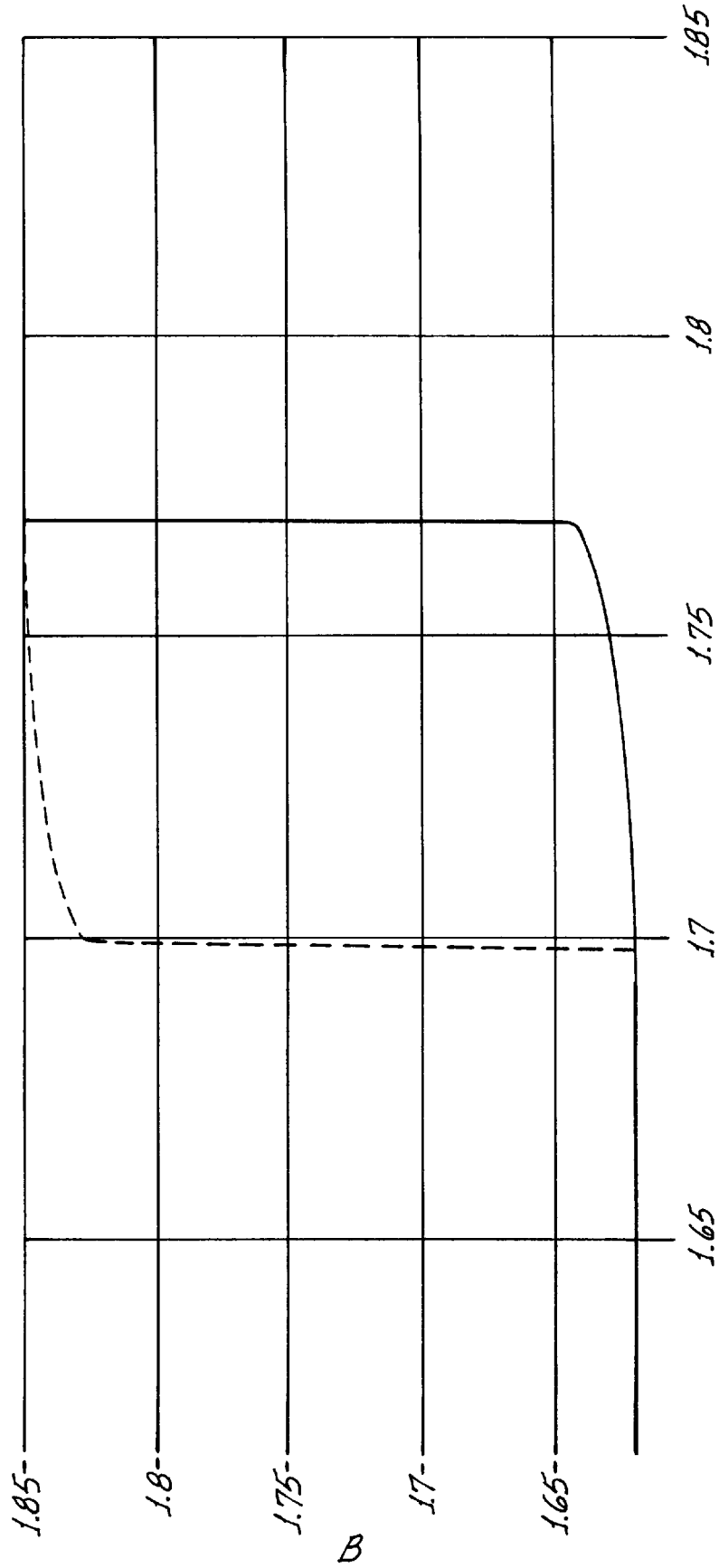
FIG. 13 is a computer generated plot of the transfer characteristics of the present invention implemented in Emitter Coupled Logic (ECL).

FIG. 13 is a computer generated graph of the switching characteristics of the present invention. Note the sharp transitions between the logic levels forming a "hysteresis" loop, evidencing the increased noise suppression capability of the present invention.

Those skilled in the art will appreciate that various adaptations and modifications of the just-described preferred embodiments can be configured without departing from the scope and spirit of the invention. Therefore, it is to be understood that within the scope of the appended claims, the invention may be practiced other than as specifically described herein.

What is claimed is:

1. An OR/NOR gate circuit comprising:

a plurality of input transistors, each input transistor having a first connection, a second connection and a third connection, wherein the second connections of the input transistors are electrically connected and wherein the third connections of the input transistors are electrically connected;

a reference transistor having a first connection, a second connection and a third connection, the connections of the reference transistor corresponding to the first, second and third connections of the input transistors, respectively, wherein the second connection of the reference transistor is connected to the second connections of the input transistors; and a feedback means for electrically connecting the first connection of the reference transistor with the third connections of the input transistors wherein the feedback means comprises a direct electrical connection from the third connections of the input transistors to the first connection of the reference transistor;

wherein a plurality of logic input signals are applied to the first connections of the input transistors such that the first connection of each input transistor has one logic input signal applied.

2. The OR/NOR gate circuit of claim 1, further comprising:

a current source means for generating a current, the current source means is connected to the second connections of the input transistors and to the second connection of the reference transistor; wherein the current is directed away from the input and reference transistors.

3. The OR/NOR gate circuit of claim 2, further comprising:

a first resistor connected between the third connection of the reference transistor and a supply voltage; and a second resistor connected between the third connections of the input transistors and the supply voltage;

wherein a NOR output signal is generated at a junction of the second resistor and the third connections of the input transistors, and an OR output signal is generated at a junction of the first resistor and the third connection of the reference transistor.

4. The OR/NOR gate circuit of claim 3, wherein the feedback means comprises a feedback transistor, the feedback transistor having a first, second and third connection, the first connection is connected to the third connections of the input transistors, the third connection is connected to the supply voltage, and the second connection is connected to the first connection of the reference transistor and to a second current source means, wherein the second current source means directs a current away from the feedback transistor.

5. The OR/NOR gate circuit of claim 3 implemented in current Mode Logic.

6. The OR/NOR gate circuit of claim 4 implemented in Emitter Coupled Logic.

7. The OR/NOR gate circuit of claim 3, wherein the input and reference transistors are bipolar transistors such that the first connection of the input and reference transistors is a base, the second connection of the input and reference transistors is an emitter, and the third connection of the input and reference transistors is a collector.

8. The OR/NOR gate circuit of claim 3, wherein the input and reference transistors are field effect transistors such that the first connection of the input and reference transistors is a gate, the second connection of the input and reference transistors is a source, and the third connection of the input and reference transistors is a drain.

* * * * *